US008465852B2

(12) United States Patent
Yamamoto

(10) Patent No.: US 8,465,852 B2
(45) Date of Patent: Jun. 18, 2013

(54) OXIDE FILM, OXIDE FILM COATED MATERIAL AND METHOD FOR FORMING AN OXIDE FILM

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 451 days.

(21) Appl. No.: 12/668,786

(22) PCT Filed: Jul. 9, 2008

(86) PCT No.: PCT/JP2008/062410
§ 371 (c)(1),
(2), (4) Date: Jan. 12, 2010

(87) PCT Pub. No.: WO2009/016932
PCT Pub. Date: Feb. 5, 2009

(65) Prior Publication Data
US 2010/0209718 A1 Aug. 19, 2010

(30) Foreign Application Priority Data
Aug. 2, 2007 (JP) .................................. 2007-202193

(51) Int. Cl.
*B32B 9/00* (2013.01)
(52) U.S. Cl.
USPC ................. 428/697; 204/192.15; 204/192.16; 428/699; 428/701; 428/702
(58) Field of Classification Search
USPC .................. 428/697, 699, 701, 702; 204/192, 204/192.15, 192.16
See application file for complete search history.

(56) References Cited

U.S. PATENT DOCUMENTS

| | | | | |
|---|---|---|---|---|
| 4,284,687 A | * | 8/1981 | Dreyer et al. | 428/472 |
| 4,599,281 A | * | 7/1986 | Schintlmeister et al. | 428/699 |
| 5,310,607 A | | 5/1994 | Schulz et al. | |
| 5,503,913 A | * | 4/1996 | Konig et al. | 428/701 |
| 5,683,825 A | | 11/1997 | Bruce et al. | |
| 5,716,720 A | | 2/1998 | Murphy | |
| 5,856,027 A | | 1/1999 | Murphy | |
| 5,934,900 A | * | 8/1999 | Billings | 428/697 |
| 6,207,589 B1 | * | 3/2001 | Ma et al. | 438/785 |
| 6,297,539 B1 | * | 10/2001 | Ma et al. | 257/410 |
| 6,451,180 B1 | | 9/2002 | Schiller et al. | |
| 6,677,064 B1 | * | 1/2004 | Subramanian | 428/702 |
| 6,824,601 B2 | * | 11/2004 | Yamamoto et al. | 428/699 |
| 7,018,727 B2 | * | 3/2006 | Dzick | 428/699 |
| 7,410,707 B2 | * | 8/2008 | Fukui et al. | 428/697 |
| 7,541,005 B2 | * | 6/2009 | Kulkarni et al. | 422/177 |

FOREIGN PATENT DOCUMENTS

| | | |
|---|---|---|
| JP | 8 260128 | 10/1996 |
| JP | 9 279364 | 10/1997 |
| JP | 10-110279 A | 4/1998 |
| JP | 10 255825 | 9/1998 |
| JP | 11 293452 | 10/1999 |
| JP | 2002-33320 A | 1/2002 |
| JP | 3323534 | 9/2002 |
| JP | 2002 544379 | 12/2002 |
| JP | 2003 13259 | 1/2003 |

OTHER PUBLICATIONS

An, Kyongjun. et al., "Microstructure, Texture, and Thermal Conductivity of Single-Layer and Multilayer Thermal Barrier Coatings of $Y_2O_3$-Stabilized $ZrO_2$ $Al_2O_3$ Made by Physical Vapor Deposition", Journal of the American Ceramic. Society, vol. 82, No. 2, pp. 399-406, ISSN:0002-7820, Feb. 1999.
Japanese Office Action issued Jul. 3, 2012 in Patent Application No. 2009-128901 with English Translation.

* cited by examiner

*Primary Examiner* — Archene Turner
(74) *Attorney, Agent, or Firm* — Oblon, Spivak, McClelland, Maier & Neustadt, L.L.P.

(57) ABSTRACT

An oxide film, an oxide film coated material and a method for forming the oxide film, which oxide film is more excellent in wear resistance than existing aluminum oxide-based oxide films are provided. The oxide film of the invention is an oxide film consisting of $(Zr_{1-a-b-c}Al_aMg_bY_c)(O_{1-x}N_x)$, characterized in that the following formulas (1)-(5) are satisfied (first invention)

$0 \leq a \leq 0.7$     formula (1)

$0 \leq b \leq 0.15$     formula (2)

$0 \leq c \leq 0.15$     formula (3)

$0 < b+c$     formula (4)

$0 \leq x \leq 0.5$     formula (5)

(wherein a represents an atomic ratio of Al, b represents an atomic ratio of Mg, c represents an atomic ratio of Y, 1-a-b-c represents an atomic ratio of Zr, x represents atomic ratio of N, and 1-x represents an atomic ratio of O.)

20 Claims, No Drawings

OXIDE FILM, OXIDE FILM COATED MATERIAL AND METHOD FOR FORMING AN OXIDE FILM

TECHNICAL FIELD

This invention belongs to a technical field relating to an oxide film, an oxide film coated material, and a method for forming an oxide film. More particularly, the invention belongs to a technical field relating to an oxide film that is excellent in wear resistance and can be favorably used as a coated film for cutting tools, molding and forming dies and the like.

BACKGROUND ART

It has been hitherto known that oxides are used for cutting tools, wherein oxide films mainly composed of aluminum oxide (alumina) are formed predominantly according to a CVD method (chemical vapor deposition method). The CVD method cannot be employed for tools whose blade edge is sharp or axle tools because the treating temperature upon the formation is generally as high as 1000° C. or over and thus, studies have been made on formation techniques by a PVD method (physical vapor deposition method). In Japanese Patent Publication No. 3323534, there has been proposed a method of forming (Al, Cr) oxides by a PVD method. In Japanese Laid-open Patent Application No. 2002-544379, there is described a method wherein γ-alumna is formed on a tool according to a pulse sputtering method.

DISCLOSURE OF THE INVENTION

Problem to be Solved by the Invention

It is known that an α or γ aluminum oxide is formed by the PVD method. For the formation of the α type, high temperatures exceeding 700° C. are needed, and the γ type can be formed at low temperatures, with an attendant problem that thermal stability at high temperatures is poor. In the abovementioned Japanese Patent Publication No. 3323534, it is stated that Cr, which enables α-oxide crystals to be formed at lower temperatures, is added so as to provide (Al, Cr) oxides, thereby obtaining an α-structure at low temperatures. However, the addition of Cr results in the lowering of wear resistance.

The present invention has been made under these circumstances and has for its object the provision of an oxide film, an oxide film coated material and a method for forming the oxide film, which film is more excellent in wear resistance than hitherto known aluminum oxide-based oxide films.

Means for Solving the Problem

In order to achieve the above object, the present inventors have made intensive studies and, as a result, arrived at completion of the invention. According to the invention, the above object can be attained.

The invention completed in this way and capable of achieving the above object provides an oxide film, an oxide film coated material and a method for forming the oxide film, which are, respectively, configured as follows.

More particularly, an oxide film according to the invention is an oxide film consisting of $(Zr_{1-a-b-c}Al_aMg_bY_c)(O_{1-x}N_x)$, characterized in that the following formulas (1)-(5) are satisfied (first invention).

$$0 \leq a \leq 0.7 \quad \text{formula (1)}$$

$$0 \leq b \leq 0.15 \quad \text{formula (2)}$$

$$0 \leq c \leq 0.5 \quad \text{formula (3)}$$

$$0 < b+c \quad \text{formula (4)}$$

$$0 \leq x \leq 0.5 \quad \text{formula (5)}$$

In the above formulas, a represents an atomic ratio of Al, b represents an atomic ratio of Mg, c represents an atomic ratio of Y, 1-a-b-c represents an atomic ratio of Zr, x represents atomic ratio of N, and 1-x represents an atomic ratio of O.

The oxide film related to the invention is preferably such that x is 0 [second invention].

An oxide film coated material according to the invention consists of an oxide film coated material, which is characterized by forming between the oxide film of the first or second invention and a substrate, a film made of one or more of elements belonging to groups 4a, 5a and 6a, Al and Si or a film made of one or more of elements belonging to groups 4a, 5a and 6a, Al and Si and one or more of C, N and O [third invention].

An oxide film coated material according to the invention consists of an oxide film coated material, which is characterized by alternately forming, on a substrate, a film made of one or more of elements belonging to groups 4a, 5a and 6a, Al and Si or a film made of one or more of elements belonging to groups 4a, 5a and 6a, Al and Si and one or more of C, N and O and the oxide film of the first or second invention [fourth invention].

A method for forming an oxide film according to the invention is directed to a method for forming an oxide film, characterized in that any of the oxide films of the first-fourth inventions is formed by a cathodic arc ion plating method or magnetron sputtering method.

Effects of the Invention

The oxide film according to the invention is more excellent in wear resistance than conventional aluminum oxide-based oxide films and can be favorably used as a coating film for cutting tools, molding and forming dies and the like, thus enabling improved durability thereof. The oxide film coated material according to the invention is excellent in wear resistance and can be favorably used as a cutting tool or molding and forming die material to impart improved durability thereto. According to the formation method of an oxide film related to the invention, the oxide film of the invention can be formed at temperatures lower than with the case of a CVD method.

BEST MODE FOR CARRYING OUT THE INVENTION

The oxide film according to the invention is one wherein Mg or Y is added to a Zr oxide used as a base, so that the crystal system is stabilized, partly or wholly of the film, from a monoclinic system into a tetragonal system or cubic system to increase strength of the film per se, thus imparting an excellent wear resistance thereto.

The addition of Mg or Y results in the crystallization of part of the film even though in small amounts and is thus effective, for which the total of the amounts of Mg and Y is defined as exceeding 0. More particularly, the ratio (atomic ratio b) of Mg and the ratio (atomic ratio c) in the metal elements (Zr, Al, Mg, Y) is so defined that the ratio of Mg and Y (atomic ratio b+c) exceeds 0. The ratio of Mg and Y (atomic ratio b+c) is preferably at not less than 0.03 and more preferably at not less than 0.05 because the film becomes a cubic system at not less than 0.05. However, if Mg and Y are added in excess, hardness lowers, for which the ratio of Mg (atomic ratio b) is defined at not greater than 0.15 and the ratio of Y (atomic ratio c) is defined at not greater than 0.15. The atomic ratio b is preferably at not greater than 0.1. The atomic ratio c is preferably at not greater than 0.1.

Because the addition of Al results in the formation of Al—O bond in the film to increase hardness, it is recommended to add Al. Where Al is added, the ratio (atomic ratio a) of Al in the metal elements (Zr, Al, Mg, Y) is preferably at not less than 0.1, more preferably at not less than 0.2. However, the addition exceeding 0.7 leads to amorphousness throughout the film and thus, hardness lowers, for which the ratio (atomic ratio a) is defined at not greater than 0.7. The ratio (atomic ratio a) of Al is preferably at not greater than 0.5, more preferably at not greater than 0.3.

The oxide film according to the invention comprises an oxide as a base. When N is added, thermal stability becomes lower than that with the case of oxides. Nevertheless, bond of higher hardness nitride is formed in the film, thereby increasing the film hardness as a whole. When the ratio (atomic ratio x) of N in the nonmetal elements (O, N) is at not less than 0.1, conversion to high film hardness is recognized. If the ratio exceeds 0.5, heat resistance lowers along with a lowering of cutting characteristics. Accordingly, if N is added, it is necessary that the ratio (atomic ratio x) of N be at not greater than 0.5, preferably at not greater than 0.4 and more preferably at not greater than 0.3.

The invention has been accomplished based on such knowledge. The oxide film of the invention accomplished in this way is an oxide film consisting of $(Zr_{1-a-b-c}Al_aMg_bY_c)(O_{1-x}N_x)$, characterized in that the following formulas (1)-(5) are satisfied (first invention). The oxide film of the invention is more excellent in wear resistance than existing aluminum-based oxide films and can be favorably used as a coated film for cutting tools, molding and forming dies and the like, thereby enabling improved durability. The oxide film of the invention is also excellent in thermal stability at high temperatures. The oxide film of the invention can be formed by a PVD method whose treating temperature is lower than with the case of a CVD method, thus permitting the oxide film to be appropriately used as a film coating for tools whose blade edge is sharp.

$$0 \leq a \leq 0.7 \quad \text{formula (1)}$$

$$0 \leq b \leq 0.15 \quad \text{formula (2)}$$

$$0 \leq c \leq 0.15 \quad \text{formula (3)}$$

$$0 < b+c \quad \text{formula (4)}$$

$$0 \leq x \leq 0.5 \quad \text{formula (5)}$$

wherein a represents an atomic ratio of Al, b represents an atomic ratio of Mg, c represents an atomic ratio of Y, 1-a-b-c represents an atomic ratio of Zr, x represents atomic ratio of N, and 1-x represents an atomic ratio of O.

Although the oxide film of the invention becomes highly hard by incorporation of N in the film, oxidation resistance lowers. Accordingly, in case where a tool temperature rises during use such as in dry cutting, the oxide film of the invention should preferably be free of nitrogen, i.e. the ratio (atomic ratio x) of N in the nonmetal elements (O, N)=0 (second invention).

An embodiment of the oxide film coated material according to the invention is characterized in that there is formed, between the oxide film of the invention and a substrate, a film made of one or more of elements of groups 4a, 5a and 6a, Al and Si or a film made of one or more of elements of groups 4a, 5a and 6a, Al and Si and one or more of N and O (which may be hereinafter referred to as underlying film) [third invention]. This oxide film coated material is improved in adhesion with the oxide film with the aid of the underlying film and exhibits more excellent adhesion and excellent durability. More particularly, while the oxide film takes a great negative value of free energy upon formation thereof and is inactive, adhesion to a substrate is poor. The formation between the substrate and the oxide film enables adhesion to be improved and thus, durability can be eventually improved. It will be noted that among the underlying films, the film made of one or more of elements belonging to groups 4a, 5a and 6a, Al and Si is one that is made, for example, of TiN, CrN, TiC, CrC, $TiO_2$, (Ti, Al)N, (Al, Cr)N and (Ti, Cr, Al)N. With a cemented carbide substrate, it is preferred from the standpoint of improving adhesion to use (Ti, Al)N, (Al, Cr)N or (Ti, Cr, Al)N as the above underlying film. Where the substrate used is an iron-based substrate, TiN or CrN is preferred from the standpoint of improving adhesion.

Another embodiment of the oxide film coated material according to the invention is characterized in that there are alternately formed, on a substrate, a film made of one or more of elements of groups 4a, 5a and 6a, Al and Si or a film made of one or more of elements of groups 4a, 5a and 6a, Al and Si and one or more of C, N and O (which may be hereinafter referred to as different layer) and the oxide film of the invention [fourth invention]. This oxide film coated material is improved in toughness. In general, oxide films are lower in film toughness than nitrides, with the possibility that there arises a problem on the tipping of blade edge in the course of intermittent cutting applications. However, the oxide film coated material according to this embodiment can be improved in durability by alternately forming the above-identified different layer and the oxide film of the invention to provide a multilayer. As a consequence, tipping of blade edge is unlikely to occur, thereby enabling durability to be improved. The layer-to-layer interval in this case is preferably at 10-500 nm. The film just on the substrate may be the different layer or may be the oxide film of the invention, of which the different layer is preferred from the standpoint of wear resistance. The uppermost surface film of the multilayer film may be either a different layer or the oxide film of the invention, of which the oxide film of the invention is preferred from the standpoint of wear resistance at the initial stage of use thereof. It is to be noted that the film serving as the different layer and made of one or more of elements of groups 4a, 5a and 6a, Al and Si and one or more of C, N and O includes, for example, those films consisting of TiN, CrN, TiC, CrC, $TiO_2$, (Ti, Al)N, (Al, Cr)N and (Ti, Cr, Al)N.

The oxide film of the invention is preferably formed by PVD methods, of which it is preferred to form the film by a cathodic arc ion plating (AIP) method or a magnetron sputtering method. More particularly, the CVD method cannot be applied to a tool whose blade edge is sharp because of the high treating temperature. In contrast, with the PVD method, treating temperatures are so low that application to a sharp blade edge tool is possible, for which formation by the PVD method is preferred. Where the oxide film of the invention is formed by evaporating a metal target in an atmosphere of oxygen by a PVD method, a difficulty is involved in controlling the film composition in a method of melting the target, such as an electron beam deposition, because a plurality of elements having different melting points are contained. In contrast, with the cathodic arc ion plating method or magnetron sputtering method, it is easy to control the film composition. In this sense, it is preferred to adopt the cathodic arc ion plating method or magnetron sputtering method selected among the PVD methods. In this view, the method for forming an oxide film of the invention is characterized by forming the oxide film of the invention by a cathodic arc ion plating method or magnetron sputtering method. [fifth invention].

EXAMPLES

Examples of the invention and comparative examples are illustrated below. It is to be noted that the invention should not be construed as being limited to the examples, and the invention can be carried out by adding appropriate alterations within a range capable of being adapted to the purport of the invention, and all of these are incorporated within a technical range of the invention.

Example 1

A metal target containing Zr and one or more of Al, Mg and Y was used to form oxide films of the formulations indicated in Table 1 by means of a magnetron sputtering film-forming apparatus or a cathodic arc ion plating film-forming apparatus having an arc evaporation source.

In this example, a mirror-polished cemented carbide substrate was used as a substrate in the case of film formation for checking a film composition and hardness. In the case of film formation for cutting test, a cemented carbide insert (SNGA 120408) was used, on which oxide films having compositions indicated in Table 1 were formed, respectively. With the case of forming any of the films, a substrate was introduced into a chamber of the film-forming apparatus and the chamber was vacuumed (evacuated to $1\times10^{-3}$ Pa or below), followed by heating the substrate to about 600° C. and subjecting to sputter cleaning with Ar ions. Thereafter, with film formation using an arc evaporation source, the film formation was made by use of a 100 mmϕ target at an arc current of 150 A in an atmosphere of Ar—$O_2$ (partial pressure of $O_2$: 0.1-0.3 Pa) at a total pressure of 1 Pa. The arc current upon film formation was set at 100 A and pulses were used for the bias applied to the substrate, under which a unipolar bias at a frequency of 30 kHz was applied to within a range of −50--100V at a duty ratio of 77%. On the other hand, with the sputtering, film formation was carried out in an atmosphere of Ar—$O_2$ (partial pressure of $O_2$: 0.1-0.3 Pa) at a total pressure of 0.6 Pa. It should be noted that in the case of forming all of the oxide films in Table 1, a TiAlN film was formed, prior to the formation of the oxide film, on the substrate as an underlying film by use of an arc evaporation source.

The films formed in this way were subjected to measurement of film hardness and a cutting test. The measurement of film hardness was carried out in such a way that a film-formed cemented carbide substrate was subjected to measurement with the Vickers microhardness tester under conditions of a measuring load of 0.25 N and a measuring time of 15 seconds. The cutting test was carried out by use, as a cutting tool, of a cemented carbide insert under cutting test conditions indicated below to evaluate a wear resistance in terms of crater wear depth. The results of the test are shown in Table 1. It will be noted that the values at the column of composition are those values expressed by atomic ratio.

[Cutting Test Conditions]
Work piece: FCD400
Cutting speed: 200 m/minute
Depth of cut: 3 mm
Feed: 0.2 mm/rev.
Others: dry cutting, no air blow, a cutting time of 2 minutes

TABLE 1

| No. | Film-forming method | Zr | Al | Mg at % | Y | O | N | Hardness GPa | Crater wear μm |
|---|---|---|---|---|---|---|---|---|---|
| 1 | AIP | | | (Al0.5Cr0.5)O | | | | 22 | >5 |
| 2 | SP | 1 | 0 | 0 | 0 | 1 | 0 | 20 | >5 |
| 3 | SP | 0.97 | 0 | 0 | 0.03 | 1 | 0 | 25 | 3.2 |
| 3a | SP | 0.95 | 0 | 0 | 0.05 | 1 | 0 | 25 | 2.6 |
| 4 | SP | 0.93 | 0 | 0 | 0.07 | 1 | 0 | 28 | 2.4 |
| 5 | SP | 0.9 | 0 | 0 | 0.1 | 1 | 0 | 26 | 2.5 |
| 6 | SP | 0.85 | 0 | 0 | 0.15 | 1 | 0 | 24 | 3.6 |
| 7 | SP | 0.8 | 0 | 0 | 0.2 | 1 | 0 | 18 | >5 |
| 8 | SP | 0.97 | 0 | 0.01 | 0.02 | 1 | 0 | 25 | 3.5 |
| 9 | SP | 0.93 | 0 | 0.02 | 0.05 | 1 | 0 | 27 | 2.6 |
| 10 | SP | 0.9 | 0 | 0.05 | 0.05 | 1 | 0 | 25 | 3 |
| 11 | SP | 0.4 | 0 | 0.1 | 0.5 | 1 | 0 | 24 | 3.6 |
| 12 | SP | 0.8 | 0 | 0.2 | 0 | 1 | 0 | 15 | >5 |
| 13 | AIP | 0.88 | 0.05 | 0 | 0.07 | 1 | 0 | 29 | 2.2 |
| 14 | AIP | 0.83 | 0.1 | 0 | 0.07 | 1 | 0 | 29 | 1.8 |
| 15 | AIP | 0.73 | 0.2 | 0 | 0.07 | 1 | 0 | 30 | 1.3 |
| 16 | AIP | 0.63 | 0.3 | 0 | 0.07 | 1 | 0 | 32 | 1 |
| 17 | AIP | 0.43 | 0.5 | 0 | 0.07 | 1 | 0 | 31 | 1.3 |
| 18 | AIP | 0.23 | 0.7 | 0 | 0.07 | 1 | 0 | 30 | 2.5 |
| 19 | AIP | 0.13 | 0.8 | 0 | 0.07 | 1 | 0 | 26 | 3.9 |
| 20 | AIP | 0.7 | 0.2 | 0.03 | 0.07 | 1 | 0 | 33 | 1 |
| 21 | AIP | 0.73 | 0.2 | 0 | 0.07 | 0.9 | 0.1 | 33 | 0.8 |
| 22 | AIP | 0.73 | 0.2 | 0 | 0.07 | 0.7 | 0.3 | 32 | 1.5 |
| 23 | AIP | 0.73 | 0.2 | 0 | 0.07 | 0.5 | 0.5 | 31 | 2.5 |
| 24 | AIP | 0.73 | 0.2 | 0 | 0.07 | 0.3 | 0.7 | 25 | 3.5 |

As will be seen from Table 1, the oxide films satisfying the requirements of the invention, i.e. inventive example (Nos. 3-6, 8-10, 13-18, 20-23), are high in hardness and more excellent in wear resistance because of smaller crater wear depths in the cutting test when compared with the oxide films not satisfying the requirements of the invention, i.e. comparative example (Nos. 1-2, 7, 11-12, 19, 24).

In the above example 1, the cutting test conditions are defined as indicated above. If other cutting test conditions are used (e.g. in case where a high hardness material (SKD61, HRC50) is used or an end mill that is an intermittent cutting is used as a processing procedure), the results toward a similar tendency are obtained.

Those subjected to film formation in this manner were provided as a sample. With respect to this sample, film adhesion was measured in the following way. More particularly, using a scratch test device, the sample surface was scratched with a diamond indenter having a tip radius of 200 μmR at a rate of 10 mm/minute to an extent of 100 N at a load increasing rate of 100 N/minute to determine a critical load (N) at which peeling of the film occurred, thereby evaluating adhesion in terms of this critical load (N). The results are shown in Table 2.

TABLE 2

| | Oxide film | | Underlying layer | | | |
|---|---|---|---|---|---|---|
| No. | Composition | Thickness (μm) | Composition | Thickness (μm) | Substrate | Adhesion (N) |
| 1 | (Zr0.6Al0.3Y0.1)O | 5 | None | — | Super hard | 55 |
| 2 | (Zr0.6Al0.3Y0.1)O | 5 | TiN | 3 | Super hard | 60 |
| 3 | (Zr0.6Al0.3Y0.1)O | 5 | CrN | 3 | Super hard | 60 |
| 4 | (Zr0.6Al0.3Y0.1)O | 5 | (Ti0.5Al0.5)N | 3 | Super hard | 80 |
| 5 | (Zr0.6Al0.3Y0.1)O | 5 | (Ti0.1Cr0.2Al0.7)N | 3 | Super hard | 100 |
| 6 | (zr0.6Al0.3Y0.1)O | 5 | (Al0.7Cr0.3)N | 3 | Super hard | 95 |
| 7 | (Zr0.6Al0.3Y0.1)O | 5 | None | — | HSS | 50 |
| 8 | (Zr0.6Al0.3Y0.1)O | 5 | TiN | 3 | HSS | 75 |
| 9 | (Zr0.6Al0.3Y0.1)O | 5 | CrN | 3 | HSS | 80 |
| 10 | (Zr0.6Al0.3Y0.1)O | 5 | (Ti0.5Al0.5)N | 3 | HSS | 70 |
| 11 | (Zr0.6Al0.3Y0.1)O | 5 | (Ti0.1Cr0.2Al0.7)N | 3 | HSS | 70 |
| 12 | (Zr0.6Al0.3Y0.1)O | 5 | (Al0.7Cr0.3)N | 3 | HSS | 65 |

Example 2

Using metal targets containing Zr, Al and Y, an oxide film of the composition indicated in Table 2, i.e. an oxide film made of $(Zr_{0.6}Al_{0.3}Y_{0.1})O$, was formed by using a magnetron sputtering sputtering film-forming apparatus or a cathodic arc ion plating film-forming apparatus having an arc evaporation source. This oxide film was one that was made of $(Zr_{1-a-b-c}Al_a Mg_b Y_c)(O_{1-x}N_x)$ wherein 1-a-b-c=0.6 (by atomic ratio), a=0.3 (by atomic ratio), b=0, c=0.1 (by atomic ratio) and 1-x=1 (by atomic ratio), thus being an oxide film satisfying the requirements of the invention.

The substrate used was a mirror-polishing cemented carbide substrate or HSS (high speed tool steel). The substrate was introduced into a chamber of the film-forming apparatus and the chamber was vacuumed (evacuated to $1\times10^{-3}$ Pa or below), followed by heating the substrate to about 600° C. and sputter cleaning with Ar ions. Thereafter, with the film formation using an arc evaporation source, the film was formed by use of a 100 mm φ target at an arc current of 150 A in an atmosphere of Ar—$O_2$ (partial pressure of $O_2$: 0.1 Pa) at a total pressure of 1 Pa. The arc current upon film formation was at 100 A, pulses were used as the bias applied to the substrate, and a unipolar bias of a frequency of 30 kHz was applied to within a range of −50--100V at a duty ratio of 77%. On the other hand, with the sputtering, the film formation was carried out in an atmosphere of Ar—$O_2$ (partial pressure of $O_2$: 0.1 Pa) at a total pressure of 0.6 Pa. Except for a part thereof, underlying films (layers) of the compositions indicated in Table 2 were formed on the substrate by use of an arc evaporation source prior to the formation of the oxide film, on which the above-mentioned oxide film was formed. No underlying film (layer) was formed with respect to the part.

As will be apparent from Table 2, the oxide film coated materials satisfying the requirements of the third invention, i.e. the third inventive example (Nos. 2-6, 8-12), are higher in critical load (N), at which film peeling takes place in the adhesion measuring test and are thus more excellent in adhesion when compared with the oxide film coated material not satisfying the third invention (although the oxide film per se satisfies the requirements of the invention).

It will be noted that although the oxide film made of $(Zr_{0.6}Al_{0.3}Y_{0.1})$ was used as an oxide film in the above example 2, results toward a similar tendency as in the above example 2 were obtained when using oxide films of the invention other than the above. In the above example 2, the thickness of the underlying film (layer) was set at 3 μm, results toward a similar tendency as in the above example 2 when the thickness of the underlying film (layer) was set at other levels of thickness (e.g. 1 μm, 5 μm).

Example 3

Using a magnetron sputtering sputtering film-forming apparatus or a cathodic arc ion plating film-forming apparatus having an arc evaporation source, a film having a multilayer structure (multilayer film) wherein A layer (oxide film) and B layer (different layer), indicated in Table 3, were alternately formed was formed on a substrate. Additionally, the A layer alone (oxide film) was formed on the substrate. This A layer is an oxide film made of $(Zr_{0.6}Al_{0.3}Y_{0.1})O$ in all cases. The B layer is a film made of $(Ti_{0.5}Al_{0.5})N$, CrN, $(Ti_{0.1}Cr_{0.2}Al_{0.7})$ or $(Al_{0.7}Cr_{0.3})N$. With the multilayer films, the thickness of the A layer, the thickness of the B layer and the number of laminated layers are such as those indicated in Table 3. It will be noted that the number of laminated layers was at (the number of the A layers+the number of the B layers)/2. The film just on the substrate was the B layer and the film at the uppermost surface of the multilayer film was the A layer.

The substrate used in this case was a mirror-polished cemented carbide substrate with the case of film formation for checking a film composition and hardness, and was a cemented carbide insert (SNGA 120408) with the case of film formation for cutting test, on which the oxide film of the composition indicated in Table 1 was formed. With the formation of any films, the substrate was introduced into a chamber of the film-forming apparatus and the chamber was vacuumed (or evacuated to $1\times10^{-3}$ Pa or below), followed by heating the substrate to about 600° C. and subsequently subjecting to sputter cleaning with Ar ions. Thereafter, with the case of film formation using an arc evaporation source, the film formation was carried out by use of a 100 mm φ target at an arc current of 150 A in an atmosphere of Ar—$O_2$ (partial pressure of $O_2$: 0.1-0.3 Pa) at a total pressure of 1 Pa. The arc current upon the film formation was at 100 A, pulses were used as a bias applied to the substrate, and a unipolar bias of a frequency of 30 kHz was applied within a range of −50−−100 V at a duty ratio of 77%. On the other hand, with sputtering, film formation was carried out in an atmosphere of Ar—$O_2$ (partial pressure of $O_2$: 0.1-0.3 Pa) at a total pressure of 0.6 Pa. In this regard, however, in the case of forming any oxide films of Table 3, a TiAlN film was formed as an underlying film on the substrate by use of an arc evaporation source prior to the formation of the oxide film.

Those obtained by the film formation in such a way were subjected to measurement of film hardness and a cutting test. The measurement of the film hardness was made in the same manner as in Example 1. The cutting test was carried out in the same manner as in Example 1 using a film-formed cemented carbide insert as a cutting tool. Like Example 1, a wear resistance was evaluated in terms of crater wear depth. The results are shown in Table 3.

the uppermost surface film of the multilayer film, results toward a similar tendency as in the above example 3 are obtained.

INDUSTRIAL APPLICABILITY

The oxide film according to the invention is more excellent in wear resistance than conventional aluminum oxide-based oxide films and can be favorably used as a covering film such as for cutting tools, molding and forming dies and the like, ensuring improved durability thereof and thus being useful.

As stated hereinabove, the invention has been described in details with reference to specific embodiments and it will be apparent to those skilled in the art that many variations and modifications may be added without departing from the spirit and scope of the invention. This application is based on Japanese Patent Application (Patent Application No. 2007-202193), filed on Aug. 2, 2007, whose contents are incorporated herein by reference.

The invention claimed is:

1. An oxide film coated material, comprising an oxide film, an underlying film, and a substrate,
wherein:
the oxide film coated material is formed by a cathodic arc ion plating process with a metallic target comprising Zr, Al and one or more of Mg and Y to form a multilayer comprising at least one underlying film alternately formed between at least one oxide film and the substrate, such that a layer-to-layer interval of the multilayer ranges from 10 to 500 nm;

TABLE 3

| | Oxide film (A layer) | | B layer | | Number of laminations | Total film thickness (μm) | Crater wear (μm) |
|---|---|---|---|---|---|---|---|
| No. | Composition | Thickness (nm) | Composition | Thickness (nm) | | | |
| 1 | (Zr0.6Al0.3Y0.1)O | 10000 | None | — | — | 10 | 3.1 |
| 2 | (Zr0.6Al0.3Y0.1)O | 2 | (Ti0.5Al0.5)N | 2 | 25000 | 10 | 3 |
| 3 | (Zr0.6Al0.3Y0.1)O | 5 | CrN | 5 | 10000 | 10 | 2.5 |
| 4 | (Zr0.6Al0.3Y0.1)O | 25 | (Ti0.5Al0.5)N | 25 | 2000 | 10 | 2 |
| 5 | (Zr0.6Al0.3Y0.1)O | 50 | (Ti0.1Cr0.2Al0.7)N | 50 | 1000 | 10 | 1.7 |
| 6 | (Zr0.6Al0.3Y0.1)O | 100 | (Al0.7Cr0.3)N | 100 | 500 | 10 | 2.2 |
| 7 | (Zr0.6Al0.3Y0.1)O | 250 | (Al0.7Cr0.3)N | 250 | 200 | 10 | 2.6 |
| 8 | (Zr0.6Al0.3Y0.1)O | 500 | (Al0.7Cr0.3)N | 500 | 100 | 10 | 3 |
| 9 | (Zr0.6Al0.3Y0.1)O | 1000 | (Al0.7Cr0.3)N | 1000 | 50 | 10 | 3.1 |

As will be apparent from Table 3, the oxide film coated materials satisfying the requirements of the fourth invention, i.e. the fourth inventive example (Nos. 2-9), exhibit a crater wear depth, determined by the cutting test, which is equal to or smaller than the oxide film coated material not satisfying the requirements of the fourth invention (although the oxide film per se satisfying the requirements of the first invention) and are thus excellent in wear resistance. It will be noted that almost all of the former inventive example (Nos. 3-8) are smaller in crater wear depth determined by the cutting test than the latter comparative example (No. 1) and is thus excellent in wear resistance.

It will be noted that in the above example 3, the film just on the substrate was the B layer and the uppermost surface layer of the multilayer film was the A layer. Instead, where the B layer was provided as the uppermost surface film of the multilayer film, results toward a similar tendency as in the example 3 are obtained. Where the A layer was provided as the film just on the substrate, results toward a similar tendency as in example 3 are obtained. Where the A layer was provided as a film just on the substrate and the B layer was provided as the oxide film has a Vickers microhardness ranging from 29 to 33 GPa and comprises $(Zr_{1-a-b-c}Al_aMg_bY_c)(O_{1-x}N_x)$ wherein formulas (1)-(5) are satisfied:

$0 \leq a \leq 0.7$      formula (1);

$0 \leq b \leq 0.15$      formula (2);

$0 \leq c \leq 0.15$      formula (3);

$0 < b+c$      formula (4);

$0 \leq x \leq 0.5$      formula (5), such that a is an atomic ratio of Al, b is an atomic ratio of Mg, c is an atomic ratio of Y, 1-a-b-c is an atomic ratio of Zr, x is an atomic ratio of N, and 1-x is an atomic ratio of O; and
the underlying film is either:
a first film consisting of one or more of elements of groups 4a, 5a and 6a, Al and Si; or
a second film consisting of one or more of elements of groups 4a, 5a and 6a, Al and Si and one or more of C, N and O.

2. The oxide film coated material according to claim 1, wherein, in formula (5), x is 0.

3. The oxide film coated material, according to claim 1, wherein the underlying film is the first film.

4. The oxide film coated material, according to claim 1, wherein the underlying film is the second film.

5. A method for forming an oxide film, the method comprising forming an oxide film by cathodic arc ion plating, said oxide film comprising $(Zr_{1-a-b-c}Al_aMg_bY_c)(O_{1-x}N_x)$ wherein formulas (1)-(5) are satisfied:

$$0 \leq a \leq 0.7 \quad \text{formula (1);}$$

$$0 \leq b \leq 0.15 \quad \text{formula (2);}$$

$$0 \leq c \leq 0.15 \quad \text{formula (3);}$$

$$0 < b+c \quad \text{formula (4);}$$

$$0 \leq x \leq 0.5 \quad \text{formula (5),}$$

such that a is an atomic ratio of Al, b is an atomic ratio of Mg, c is an atomic ratio of Y, 1-a-b-c is an atomic ratio of Zr, x is an atomic ratio of N, and 1-x is an atomic ratio of O.

6. The oxide film coated material according to claim 1, wherein the oxide film consists essentially of the $(Zr_{1-a-b-c}Al_aMg_bY_c)(O_{1-x}N_x)$.

7. The oxide film coated material according to claim 1, wherein, in formula (2):

$$0 < b \leq 0.15.$$

8. The oxide film coated material according to claim 1, wherein, in formula (3):

$$0 < c \leq 0.15.$$

9. The oxide film coated material according to claim 1, wherein, in formulas (2) and (3):

$$0 < b \leq 0.15; \text{ and}$$

$$0 < c \leq 0.15.$$

10. The oxide film coated material according to claim 1, wherein, in formula (1):

$$0 < a \leq 0.7.$$

11. The oxide film coated material according to claim 1, wherein, in formulas (1)-(3):

$$0 < a \leq 0.7;$$

$$0 < b \leq 0.15; \text{ and}$$

$$0 < c \leq 0.15.$$

12. The oxide film coated material according to claim 1, wherein, in formula (5):

$$0 < x \leq 0.5.$$

13. The oxide film coated material according to claim 1, wherein, in formula (1)-(3) and (5):

$$0 < a \leq 0.7;$$

$$0 < b \leq 0.15;$$

$$0 < c \leq 0.15; \text{ and}$$

$$0 < x \leq 0.5.$$

14. The oxide film coated material according to claim 1, wherein the oxide film has a crate wear depth in a range of from 0.8 to 3.2 µm.

15. The oxide film coated material according to claim 1, wherein the oxide film has a crate wear depth in a range of from 0.8 to 2.5 µm.

16. The oxide film coated material according to claim 9, wherein b+c is not less than 0.05.

17. The oxide film coated material according to claim 3, wherein the first film includes Al.

18. The oxide film coated material according to claim 3, wherein the first film includes Ti or Cr.

19. The oxide film coated material according to claim 4, wherein the second film includes Al.

20. The oxide film coated material according to claim 4, wherein the second film includes Ti or Cr.

* * * * *